United States Patent
Hioka et al.

(10) Patent No.: US 8,427,140 B2
(45) Date of Patent: Apr. 23, 2013

(54) HALL SENSOR

(75) Inventors: Takaaki Hioka, Chiba (JP); Toshihiko Omi, Chiba (JP)

(73) Assignee: Seiko Instruments Inc. (JP)

( * ) Notice: Subject to any disclaimer, the term of this patent is extended or adjusted under 35 U.S.C. 154(b) by 61 days.

(21) Appl. No.: 13/135,301

(22) Filed: Jun. 30, 2011

(65) Prior Publication Data
US 2012/0001280 A1    Jan. 5, 2012

(30) Foreign Application Priority Data

Jul. 5, 2010 (JP) .................................. 2010-153109
May 20, 2011 (JP) .................................. 2011-113472

(51) Int. Cl.
*H01L 43/06* (2006.01)
*G01R 33/06* (2006.01)

(52) U.S. Cl.
USPC .................... 324/207.2; 324/251; 324/117 H; 365/145; 257/421; 257/40

(58) Field of Classification Search ............... 324/207.2, 324/251, 117 H; 365/145; 257/40, 421
See application file for complete search history.

(56) References Cited

U.S. PATENT DOCUMENTS

| | | | | |
|---|---|---|---|---|
| 8,085,035 B2* | 12/2011 | Namai et al. | ................ | 324/207.2 |
| 2004/0129934 A1* | 7/2004 | Takatsuka | ........................ | 257/40 |
| 2004/0251507 A1* | 12/2004 | Nakamura et al. | ............. | 257/421 |
| 2007/0046287 A1* | 3/2007 | Vervaeke et al. | ............. | 324/251 |
| 2007/0171695 A1* | 7/2007 | Aouba et al. | .................. | 365/145 |

FOREIGN PATENT DOCUMENTS

| | | |
|---|---|---|
| JP | 62208683 | 9/1987 |
| JP | 06186103 | 7/1994 |

* cited by examiner

*Primary Examiner* — Michael Shingleton
(74) *Attorney, Agent, or Firm* — Adams & Wilks

(57) ABSTRACT

Provided is a highly-sensitive Hall element capable of eliminating an offset voltage without increasing the chip size. The Hall element includes: a Hall sensing portion having a shape of a cross and four convex portions; Hall voltage output terminals which are arranged at the centers of the front edges of the four convex portions, respectively; and control current input terminals which are arranged on side surfaces of each of the convex portions independently of the Hall voltage output terminals. In this case, the Hall voltage output terminal has a small width and the control current input terminal has a large width.

7 Claims, 5 Drawing Sheets

Prior Art

Prior Art

Prior Art

HALL SENSOR

BACKGROUND OF THE INVENTION

1. Field of the Invention

The present invention relates to a semiconductor Hall element, and more particularly, to a highly-sensitive Hall sensor capable of eliminating an offset voltage.

2. Description of the Related Art

At first, the principle for detecting magnetism of a Hall element is described. When a magnetic field is applied perpendicularly to a current flowing through a substance, an electric field, which causes a Hall voltage, is generated in a direction perpendicular to both the current and the magnetic field.

Consider a Hall element illustrated in FIG. 2. When the width of a Hall sensing portion 1 which generates the Hall voltage according to the magnetic field is represented by W, the length thereof is represented by L, electron mobility thereof is represented by $\mu$, an applied voltage of a power source 2 for supplying a current is represented by Vdd, and an applied magnetic field is represented by B, the Hall voltage VH appearing on a voltmeter 3 is expressed by:

$$VH=\mu B(W/L)Vdd,$$

and magnetic sensitivity Kh of the Hall element is expressed by:

$$Kh=\mu(W/L)Vdd.$$

The expressions above show that one of the methods for increasing the sensitivity of the Hall element is to increase the ratio W/L.

On the other hand, in an actual Hall element, an output voltage is generated even when no magnetic field is applied. The output voltage under a zero magnetic field is called offset voltage. It is considered that an imbalanced potential distribution inside the element generates the offset voltage due to mechanical stress applied to the element from the outside or due to misalignment occurring in a manufacturing process.

The following methods are generally employed to compensate the offset voltage to a level allowable for practical use through cancellation or the like.

The first method uses an offset cancellation circuit utilizing spinning current as illustrated in FIG. 3.

A Hall sensing portion 10 has a symmetrical shape and includes four terminals T1, T2, T3, and T4, in which a control current is supplied between one pair of input terminals and an output voltage is obtained between the other pair of output terminals. When one pair of the terminals T1 and T2 of the Hall sensing portion serves as control current input terminals, the other pair of the terminals T3 and T4 serves as Hall voltage output terminals. In this case, when a voltage Vin is applied to the input terminals, an output voltage Vh+Vos is generated between the output terminals, where Vh represents a Hall voltage proportional to a magnetic field of the Hall element and Vos represents an offset voltage. Next, with the terminals T3 and T4 serving as the control current input terminals and the terminals T1 and T2 serving as the Hall voltage output terminals, the input voltage Vin is applied between the terminals T3 and T4 to generate a voltage −Vh+Vos between the output terminals. Subtraction between the two output voltages, each obtained by applying a current flowing in one of the two directions described above, cancels the offset voltage Vos to obtain an output voltage 2 Vh proportional to the magnetic field (see, for example, Japanese Patent Application Laid-open No. JP 06-186103 A).

The second method uses two Hall elements having the same shape connected in series. Each Hall sensing portion is disposed in proximity in a direction in which the two Hall elements are orthogonal to each other, to thereby eliminate the unbalance of voltages caused by stress (see, for example, Japanese Patent Application Laid-open No. JP 62-208683 A).

However, in the method of the first one (JP 06-186103 A), unless the currents applied to the Hall sensing portion in two directions or the output Hall voltages therefrom are the same, the offset voltage cannot be eliminated by utilizing spinning current. The Hall element is hence required to have a symmetrical shape and the four terminals are also required to have the same shape. Accordingly, there is a problem that the ratio W/L cannot be increased to improve the sensitivity of the Hall element.

Further, in the method of the second one (JP 62-208683 A), the ratio W/L can be determined arbitrarily, permitting the increase in the sensitivity. However, since a plurality of the Hall elements are used, there is a problem that the chip size increases, leading to an increase in cost.

In addition, the offset voltage elimination by the spinning current is insufficient to eliminate the offset voltage in some cases. The reason is described as follows.

The Hall element is represented by an equivalent circuit illustrated in FIG. 4. The Hall element is represented by a bridge circuit in which the four terminals are connected to one another via four resistors R1, R2, R3, and R4. When the Hall element has a symmetrical shape, the four resistors R1, R2, R3, and R4 have the same resistance. In an actual case, however, the resistance varies depending on stress, processing accuracy in the manufacturing process, and the like. In the manner as described above, one output voltage is subtracted from the other, each of which is obtained by supplying a current flowing in one of two directions, to thereby cancel the offset voltage.

Consider the case where the applied magnetic field is zero. When the voltage Vin is applied between the pair of the terminals T1 and T2 of the Hall element, a Hall voltage expressed below comes out between the other pair of the terminals T3 and T4.

$$Vouta=(R2*R4-R1*R3)/(R1+R4)/(R2+R3)*Vin$$

On the other hand, when the voltage Vin is applied between the terminals T3 and T4, a Hall voltage expressed below comes out between the terminals T1 and T2.

$$Voutb=(R1*R3-R2*R4)/(R3+R4)/(R1+R2)*Vin$$

The difference between the output voltages in two directions, that is, the offset voltage is expressed below.

$$Vos=Vouta-Voutb=(R1-R3)*(R2-R4)*(R2*R4-R1*R3)/(R1+R4)/(R2+R3)/(R3+R4)/(R1+R2)*Vin$$

In this case, the offset voltage can be eliminated under the condition in which the denominator of the right side "(R1−R3)*(R2−R4)*(R2*R4−R1*R3)" is 0. Accordingly, the offset voltage can be cancelled even when the resistances of the resistors R1, R2, R3, and R4 of the equivalent circuit are different from one another. However, if the resistances of the resistors R1, R2, R3, and R4 vary between one current application direction and the other, that is, if the resistances of the four resistors R1, R2, R3, and R4 vary between when the voltage Vin is applied between one pair of the terminals T1 and T2 of the Hall element and when the voltage Vin is applied between the other pair of the terminals T3 and T4, the offset voltage Vos does not satisfy the above-mentioned expression and cannot be cancelled.

FIG. 5 is a cross-sectional view of a general Hall element. A peripheral portion of an N-type doped region 102 to become the Hall sensing portion is surrounded by a P-type impurity region for isolation. When a voltage is applied between Hall current application terminals, a depletion layer expands at a boundary between the Hall sensing portion and its peripheral portion. No Hall current flows in the depletion layer, and hence in a region of the expanding depletion layer, the Hall current is suppressed to increase the resistance. Further, the width of the depletion layer depends on the applied voltage. Accordingly, the resistances of the resistors R1, R2, R3, and R4 of the equivalent circuit illustrated in FIG. 4 are changed depending on the voltage application direction, and hence the offset cancellation circuit cannot cancel a magnetic offset.

SUMMARY OF THE INVENTION

In order to solve the above-mentioned problems, the present invention employs the following structure.

A Hall sensor according to the present invention includes: a Hall sensing portion; control current input terminals; and Hall voltage output terminals, and the control current input terminals and the Hall voltage output terminals are arranged independently of each other.

Regarding the shape of a Hall element, the Hall sensing portion has a cross shape, and the Hall voltage output terminals are arranged at front edges of the cross and the control current input terminals are arranged on side surfaces of the cross.

The arranged terminals have such shapes that the control current input terminals each have a large width on the side surfaces of the cross while the Hall voltage output terminals each have a small width at the front edge.

Further, a distance between the Hall voltage output terminals is larger than a distance between the control current input terminals.

Further, the Hall sensor according to the present invention is capable of eliminating an offset voltage by spinning current.

Still further, in order to perform offset voltage elimination by spinning current, a Hall sensor according to another aspect of the present invention includes: a Hall sensing portion constituted by an N-type doped region which is formed in a surface of a P-type semiconductor substrate; a depletion layer suppressing region constituted by an N-type lightly-doped region which is formed to surround side surfaces and a bottom surface of the N-type doped region; and control current input terminals each constituted by an N-type heavily-doped region which is provided at an end portion of the N-type doped region.

The N-type lightly-doped region serving as the depletion layer suppressing region is formed at a larger depth and a lower concentration than a depth and a concentration of the N-type doped region serving as the Hall sensing portion.

The use of the above-mentioned measures can eliminate the offset voltage by spinning current. Since the control current input terminals and the Hall voltage output terminals are arranged independently to each other, the input terminals can be formed larger while the output terminals can be formed smaller. Further, the distance W between the Hall voltage output terminals can be made larger and the distance L between the control current input terminals can be made smaller. This way, the sensitivity of the Hall element can be enhanced. Besides, the present invention can provide a highly-sensitive Hall sensor capable of eliminating an offset voltage by a single Hall element while having a small chip size.

DETAILED DESCRIPTION OF THE PREFERRED EMBODIMENT

Figure 1:
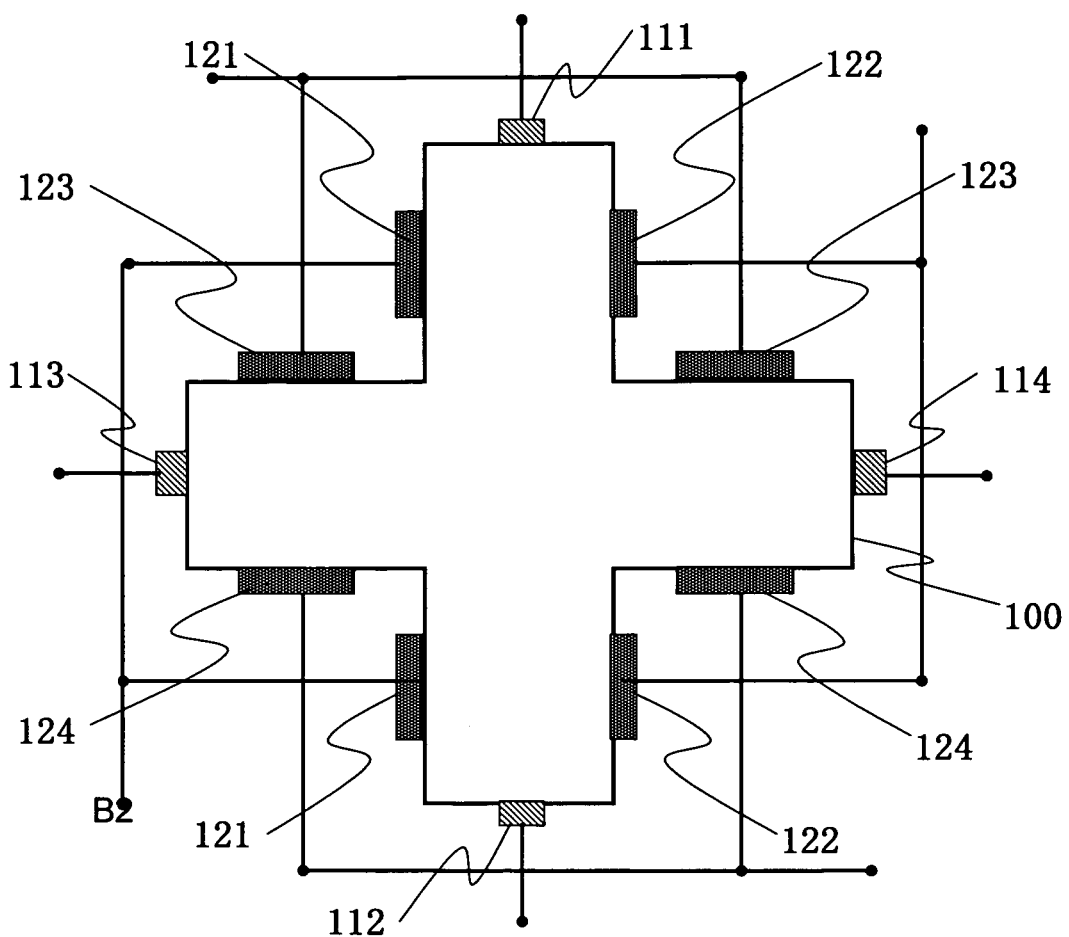
FIG. 1 is a view illustrating a structure of a Hall element according to the present invention.
Figure 2:
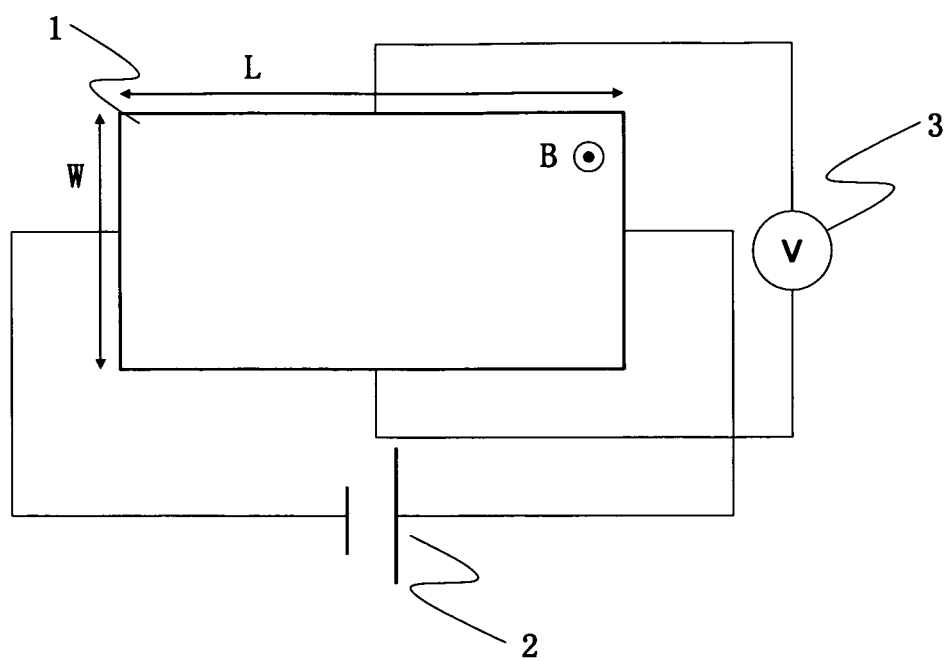
FIG. 2 is a diagram for describing the principle of an ideal Hall effect.
Figure 3:
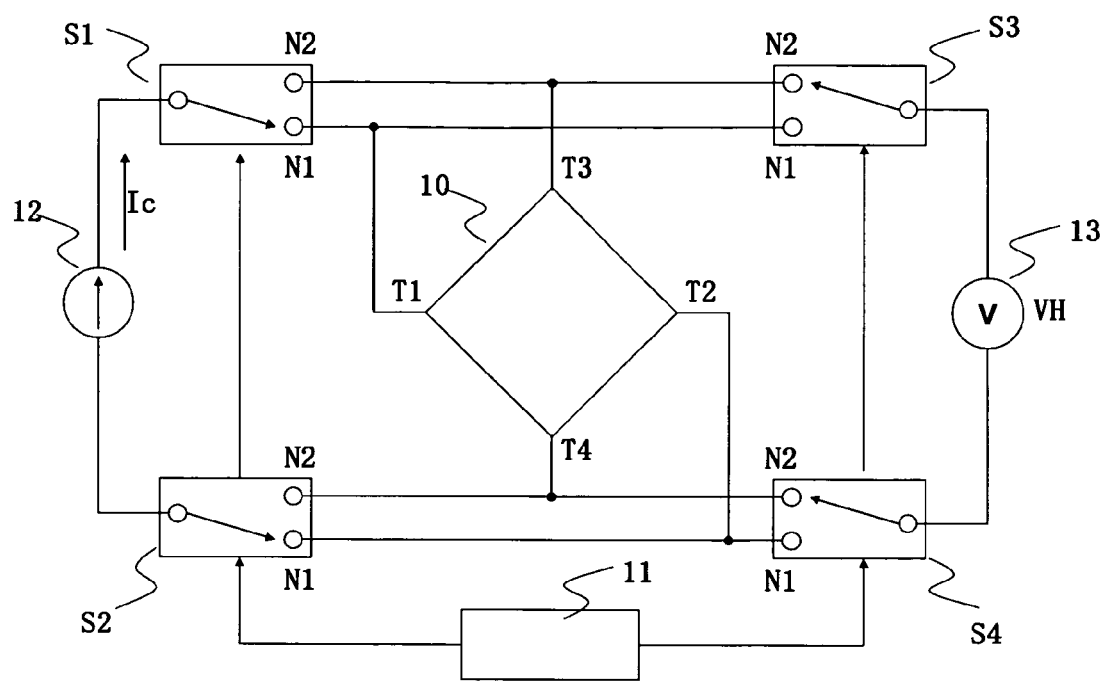
FIG. 3 is a diagram for describing a method of eliminating an offset voltage by spinning current.
Figure 4:
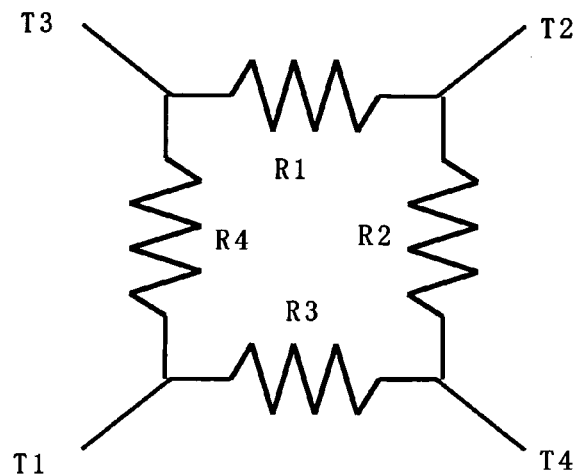
FIG. 4 is a diagram illustrating an equivalent circuit for describing an offset voltage of the Hall element.
Figure 5:
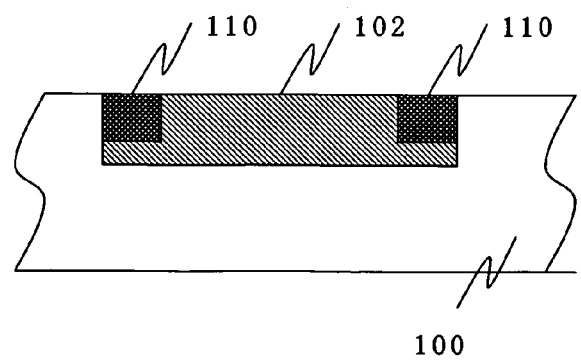
FIG. 5 is a view illustrating a cross-sectional structure of a general Hall element.

FIG. 1 is a plan view illustrating a structure of a Hall element according to an embodiment of the present invention. The Hall element of this embodiment includes a Hall sensing portion 100 having shape of a cross and a fourfold axis, rectangular Hall voltage output terminals 111, 112, 113, and 114 at the respective centers of the front edges of four convex portions of the Hall sensing portion 100, and rectangular control current input terminals 121, 122, 123, and 124 in the vicinity of the respective centers of the sides of the convex portions. Of the control current input terminals, control current input terminals arranged in line along the sides of opposed convex portions are connected to each other via metal wiring to have the same potential. Accordingly, two control current input terminals form a pair, and four pairs are provided in total.

In other words, in this embodiment, as the terminals connected to the Hall element, the Hall voltage output terminals and the control current input terminals are arranged independently of each other. In the conventional method, the same terminal serves as both the Hall voltage output terminal and the control current input terminal, and hence in order to eliminate an offset voltage, the respective shapes of the terminals cannot be changed depending on the functions. The terminals having both the two functions are thus all required to have the same shape heretofore.

However, according to the present invention, the Hall voltage output terminals and the control current input terminals are arranged independently of each other, and hence the shapes of the two kinds of terminals can be determined independently. In order to eliminate the offset voltage, the Hall voltage output terminals 111, 112, 113, and 114 have the same shape, and the control current input terminals 121, 122, 123, and 124 have the same shape.

Further, in this embodiment, the width of the Hall voltage output terminal, which is the length of the Hall voltage output terminal in contact with the Hall sensing portion, is small, whereas the width of the control current input terminal, which is the length of one control current input terminal in contact with the Hall sensing portion, is large. Specifically, it is preferred that the width of the Hall voltage output terminal and the width of the control current input terminal have a ratio in the range from 1:2 to 1:20. The increase in width of the control current input terminal can improve uniformity of currents flowing through the Hall sensing portion 100. Further, the Hall voltage output terminals are conductors, and hence the vicinities thereof may have the same potential and the Hall effect cannot be obtained in the vicinities. Accordingly, the width of the Hall voltage output terminal is reduced to suppress deterioration of Hall sensitivity.

Further, in the present invention, dimensions of the cross shape of the Hall sensing portion are set so as to have a large distance W between the Hall voltage output terminals and a small distance L between the control current input terminals to increase the ratio W/L. Hence the Hall sensitivity can be enhanced.

In addition, the width of the control current input terminal is set shorter than the length of the side surface of the convex portion of the Hall element having a shape of a cross. This avoids a problem that neighbor control current input terminals are too close to each other and a current flows between adjacent control current input terminals while no current flows through the Hall sensing portion, to thereby suppress deterioration of the Hall sensitivity.

With the structure described above, a highly-sensitive Hall sensor using a single Hall element can be provided.

Next, the structure of the Hall element is described.

The Hall sensing portion is formed using a semiconductor material (e.g., silicon) and at a low impurity concentration for increasing electron mobility and enhancing the sensitivity. However, as a concentration of an N-type doped region 102 of the Hall sensing portion is lowered, a larger depletion layer is formed at a boundary between the Hall sensing portion and its peripheral portion. This causes a problem that the offset voltage cannot be eliminated by spinning current. In order to prevent the problem, the present invention employs the structure of FIG. 6.

Figure 6:
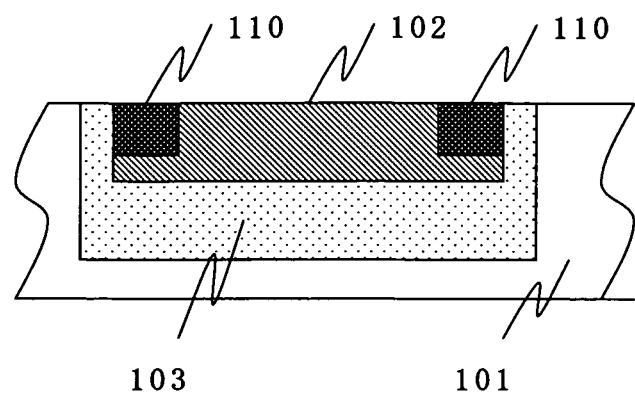
FIG. 6 is a view illustrating a cross-sectional structure of the Hall element capable of eliminating an offset voltage by spinning current.

A Hall element illustrated in FIG. 6 includes a Hall sensing portion, a depletion layer suppressing region, and control current input terminals. The Hall sensing portion is constituted by an N-type doped region 102 which is formed in the surface of a P-type semiconductor substrate 101. The depletion layer suppressing region is constituted by an N-type lightly-doped region 103 which is formed around the N-type doped region 102, that is, formed to surround the side surfaces and the bottom surface of the N-type doped region 102. The control current input terminals are each constituted by an N-type heavily-doped region 110 which is provided at an end portion of the N-type doped region 102. Now, comparing between the cross-sectional view of FIG. 6 and the plan view of FIG. 1, the structure of the Hall element is briefly described. The Hall sensing portion constituted by the N-type doped region 102 illustrated in FIG. 6 corresponds to reference numeral 100 of FIG. 1, and is a square in the plan view. At the four vertices of the square, the control current input terminals constituted by the N-type heavily-doped regions 110 are disposed. Note that, the depletion layer suppressing region constituted by the N-type lightly-doped region 103 is provided around the square Hall sensing portion, but illustration thereof is omitted in FIG. 1.

It is preferred that the N-type doped region 102 serving as the Hall sensing portion have a depth of approximately 300 nm to 500 nm and a concentration of $1 \times 10^{16}$ (atoms/cm$^3$) to $5 \times 10^{16}$ (atoms/cm$^3$) while the N-type lightly-doped region 103 serving as the depletion layer suppressing region have a depth of approximately 2 μm to 3 μm and a concentration of $8 \times 10^{14}$ (atoms/cm$^3$) to $3 \times 10^{15}$ (atoms/cm$^3$). Further, in the respective regions of the Hall voltage output terminal and the control current input terminal, concentrations of impurities (N-type) in the surface of the semiconductor material are selectively increased to form contact regions. Then, the contact regions are each connected to an electrode or an interconnect wired thereto. Then, the respective terminals are electrically connected to one another via an interconnect routing thereto. It is preferred that the N-type heavily-doped regions 110 serving as the control current input terminals and the Hall voltage output terminals have a depth of approximately 300 nm to 500 nm. In other words, the depletion layer suppressing region is formed at a larger depth and a lower concentration than those of the Hall sensing portion. Further, the control current input terminals and the Hall voltage output terminals are formed at substantially the same depth as that of the Hall sensing portion.

By maintaining the relationships described above, it is possible to supply a control current through the Hall sensing portion without experiencing effect from the depletion layer generated at a contact portion between the depletion layer suppressing region and the P-type substrate region in its peripheral portion. The above-mentioned structure of the Hall element can eliminate the offset voltage by spinning current.

Further, a manufacturing method for the Hall element of the present invention is easy. First, the N-type lightly-doped region 103 to become a depletion layer suppressing layer is formed in a P-type substrate. In this case, the N-type lightly-doped region 103 has a depth of 2 μm to 3 μm and a concentration of $8 \times 10^{14}$ (atoms/cm$^3$) to $3 \times 10^{15}$ (atoms/cm$^3$). The depth and the concentration are similar to those of the N well. Further, the N-type lightly-doped region 103 is used as the depletion layer suppressing region and hence does not affect the sensitivity or other characteristics of the Hall element even if there are large manufacturing fluctuations among the N wells. Accordingly, the N-type lightly-doped region 103 can be formed at the same time as formation of N wells of other components.

Next, the N-type doped region 102 serving as the Hall sensing portion is formed. In this case, the N-type lightly-doped region 102 has a depth of 300 nm to 500 nm and a concentration of $1 \times 10^{16}$ (atoms/cm$^3$) to $5 \times 10^{16}$ (atoms/cm$^3$). The doped region having the depth and the concentration can be formed using a normal ion implantation apparatus so as to have smaller fluctuations in depth and concentration than those of the N well. The Hall sensing portion is formed by ion implantation, to thereby form a Hall element having smaller fluctuations in sensitivity.

Finally, heavily-doped regions to become the control current input terminals and the Hall voltage output terminals are formed. The heavily-doped regions each have a depth of 300 nm to 500 nm, and can be formed easily without the need for a process particularly different from that of the other components.

Next, a method of eliminating the offset voltage is described.

First, a voltage Vdd is applied between the control current input terminals 121 and 122 to make a control current flow (in the first current direction). When the current flows, a Hall voltage is generated between the Hall voltage output terminals 111 and 112. Here, the voltage output between the Hall voltage output terminals 111 and 112 contains a Hall voltage proportional to the magnitude of a magnetic field and an offset voltage. When the output voltage is represented by V34, the Hall voltage is represented by VH34, and the offset voltage is represented by Vos34, the output voltage V34 is expressed below.

$$V34 = VH34 + Vos34$$

Next, the voltage Vdd is applied between the control current input terminals 123 and 124 to make a control current flow (in the second current direction). When the current flows, a Hall voltage is generated between the Hall voltage output terminals 113 and 114. The voltage generated between the Hall voltage output terminals 113 and 114 contains a Hall voltage proportional to the magnitude of a magnetic field and an offset voltage. When the output voltage is represented by V12, the Hall voltage is represented by VH12, and the offset voltage is represented by Vos12, the output voltage V12 is expressed below.

$$V12=VH12+Vos12$$

Here, the shape of the Hall element is a symmetrical cross shape as illustrated in FIG. 1. Further, the Hall voltage output terminals 111, 112, 113, and 114 at the front edges of the Hall sensing portion and the control current input terminals 121, 122, 123, and 124 on the side surfaces of the Hall sensing portion are arranged symmetrically and have the same shapes, respectively. The Hall voltage V34 obtained by the current flowing in the first current direction and the Hall voltage V12 obtained by the current flowing in the second current direction have a relationship in which the amounts of flowing currents and the distances between the Hall voltage output terminals are the same only with different current directions. Accordingly, the Hall voltage VH to be generated is expressed below.

$$VH=VH34=-VH12$$

The same can be applied to the offset voltage Vos, which is expressed below.

$$Vos=Vos34=Vos12$$

In other words, the voltage V34 generated between the Hall voltage output terminals 111 and 112 and the voltage V12 generated between the Hall voltage output terminals 113 and 114 are expressed below.

$$V34=VH+Vos$$

$$V12=-VH+Vos$$

The output voltage V12 obtained by the current flowing in the second current direction is subtracted from the output voltage V34 obtained by the current flowing in the first current direction, to thereby obtain a voltage Vout expressed below.

$$Vout=V34-V12=2VH$$

From the expression, the offset voltage can be eliminated and a doubled Hall voltage can be obtained.

As described above, the structure of FIG. 1 can realize a highly-sensitive Hall sensor capable of eliminating an offset voltage with a small chip size.

What is claimed is:

1. A Hall sensor, comprising:
   a Hall sensing portion having a shape of a cross, and having four convex portions and a fourfold axis;
   Hall voltage output terminals having the same shape, arranged at centers of front edges of the four convex portions, respectively; and
   control current input terminals arranged in vicinities of centers of sides of the four convex portions, respectively,
   wherein, among the control current input terminals, each pair of control current input terminals arranged in line along each of the sides of opposed convex portions is connected to each other via an interconnect to have the same potential.

2. The Hall sensor according to claim 1, wherein a width of each of the control current input terminals, which is a length of each of the control current input terminals in contact with the Hall sensing portion, is larger than a width of each of the Hall voltage output terminals, which is a length of each of the Hall voltage output terminals in contact with the Hall sensing portion.

3. The Hall sensor according to claim 1, wherein a width of each of the control current input terminals is shorter than each of the sides.

4. The Hall sensor according to claim 1, wherein a distance between opposing ones of the Hall voltage output terminals is larger than a distance between opposing ones of the control current input terminals.

5. A Hall sensor according to claims 1, wherein:
   the Hall sensing portion is constituted by an N-type doped region formed on a surface of a P-type semiconductor substrate;
   the Hall voltage output terminals and the control current input terminals provided on both sides of the Hall voltage output terminals, respectively, are each constituted by an N-type heavily-doped region, the Hall voltage output terminals and the control current input terminals being provided at end portions of the N-type doped region; and
   the Hall sensor further comprises a depletion layer suppressing region constituted by an N-type lightly-doped region which is formed to surround side surfaces and a bottom surface of the N-type doped region.

6. A Hall sensor according to claim 5, wherein the control current input terminals and the Hall voltage output terminals are formed at the same depth from the surface of the P-type semiconductor substrate as a depth of the Hall sensing portion.

7. A Hall sensor according to claims 1, which is capable of eliminating an offset voltage by spinning current.

* * * * *